US010746762B2

(12) United States Patent
Kuo

(10) Patent No.: US 10,746,762 B2
(45) Date of Patent: Aug. 18, 2020

(54) ANECHOIC CHAMBER AND SIGNAL TEST SYSTEM CONTAINING THE SAME

(71) Applicant: Quanta Computer Inc., Taoyuan (TW)

(72) Inventor: Chao-Hung Kuo, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 36 days.

(21) Appl. No.: 16/275,856

(22) Filed: Feb. 14, 2019

(65) Prior Publication Data

US 2020/0132719 A1 Apr. 30, 2020

(30) Foreign Application Priority Data

Oct. 25, 2018 (TW) .............................. 107137829 A

(51) Int. Cl.
*G01R 31/00* (2006.01)
*G01R 1/04* (2006.01)
*G01R 31/302* (2006.01)

(52) U.S. Cl.
CPC ............. *G01R 1/04* (2013.01); *G01R 31/302* (2013.01)

(58) Field of Classification Search
CPC .... G01R 29/08; G01R 29/10; G01R 29/0821; G01R 29/0871; G01R 29/105; G01R 31/28; G01R 31/302
See application file for complete search history.

(56) References Cited

U.S. PATENT DOCUMENTS

| 8,467,756 | B2* | 6/2013 | Ozaki | G01R 29/10 |
| | | | | 455/115.1 |
| 2011/0084887 | A1* | 4/2011 | Mow | G01R 29/10 |
| | | | | 343/703 |
| 2014/0327586 | A1* | 11/2014 | Huff | G01R 29/0821 |
| | | | | 343/703 |
| 2018/0172747 | A1* | 6/2018 | Qi | G01R 29/0821 |

FOREIGN PATENT DOCUMENTS

| TW | 201435362 A | 9/2014 |
| WO | 2018164627 A1 | 9/2018 |

\* cited by examiner

*Primary Examiner* — Thang X Le

(57) ABSTRACT

An anechoic chamber includes a closed chamber and a metal container. The closed chamber includes wave-absorbing inner walls located therein, and the wave-absorbing inner walls collectively define a first accommodation space. Each of the wave-absorbing inner walls includes wave absorbers arranged thereon. The metal container is removably received in the first accommodation space, and has wave-reflecting inner walls located therein. The wave-reflecting inner walls collectively define a second accommodation space which is used to receive a device under test (DUT).

10 Claims, 7 Drawing Sheets

ANECHOIC CHAMBER AND SIGNAL TEST SYSTEM CONTAINING THE SAME

RELATED APPLICATIONS

This application claims priority to Taiwan Application Serial Number 107137829, filed Oct. 25, 2018, which is herein incorporated by reference.

BACKGROUND

Field of Disclosure

The disclosure relates to a signal test system. More particularly, the disclosure relates to a signal test system capable of simulating a required test environment to test signal throughput of a device under test (DUT).

Description of Related Art

Generally, wireless signal products such as smart phones, notebook computers, tablet PCs, or all-in-one computers (AIOs) are supposed to have network signal transmission functions complying with a certain communication protocol. Thus, before the wireless signal products are shipped from the factory, the wireless signal products are needed to pass through a signal throughput test in an anechoic chamber, so as to ensure every wireless signal product to have qualified signal transmission performance.

However, if a signal throughput test for the wireless signal products is needed to be performed in various different environments (such as outdoor open space or a crowded urban area), additional anechoic chambers, and related equipment and manpower are needed to be prepared. Therefore, not only cost, manpower and test time are increased, but also configuration space cannot be saved.

SUMMARY

In one embodiment of the disclosure, a signal test system is provided and includes a first chamber, a second chamber, an accessing antenna and a testing computer. The first chamber has a first accommodation space therein. The second accommodation space is closed or unclosed, and the second chamber is removably disposed in the first accommodation space. The second chamber has a second accommodation space therein. The accessing antenna is disposed in the second accommodation space. The testing computer is located outside the first chamber, and is electrically connected to the accessing antenna for wirelessly performing a wireless signal test on a device under test (DUT) located in the second accommodation space. The first chamber is provided with wave-absorbing inner walls in the first accommodation space, and the second chamber is provided with wave-reflecting inner walls in the second accommodation space; or the first chamber is provided with wave-reflecting inner walls in the first accommodation space, and the second chamber is provided with wave-absorbing inner walls in the second accommodation space.

According to one or more embodiments of the disclosure, in the signal test system, the second chamber includes plates and connecting portions. Each of the connecting portions is foldably connected to at least two of the plates, thereby enabling the plates and the connecting portions to be assembled as a polygonal body collectively.

According to one or more embodiments of the disclosure, in the signal test system, the first chamber includes a recess and a lifting device. The recess is concavely formed on one inner wall of the first chamber, and communicates with the first accommodation space for receiving the second chamber. The lifting device is ascendably and descendably disposed in the recess to move with the second chamber collectively, such that the second chamber is able to be lifted out of the recess and moved into the first accommodation space.

According to one or more embodiments of the disclosure, the signal test system further includes an access point device and a signal shielding box. The access point device is electrically connected to the accessing antenna and the testing computer through wires. The signal shielding box hermetically receives the access point device, and shields external signals.

In one embodiment of the disclosure, an anechoic chamber includes a closed chamber and a metal container. The closed chamber includes wave-absorbing inner walls therein, and the wave-absorbing inner walls collectively define a first accommodation space. Each of the wave-absorbing inner walls includes wave absorbers arranged thereon. The metal container is removably received in the first accommodation space, and the metal container has wave-reflecting inner walls therein. The wave-reflecting inner walls collectively define a second accommodation space which is used to receive a device under test (DUT).

According to one or more embodiments of the disclosure, in the anechoic chamber, the metal container includes plates and connecting portions. Each of the connecting portions is foldably connected to at least two of the plates, thereby enabling the plates and the connecting portions to be assembled as a polygonal body collectively.

According to one or more embodiments of the disclosure, in the anechoic chamber, the closed chamber includes a recess and a lifting device. The recess is concavely formed on one of the wave-absorbing inner walls of the closed chamber, communicated with the first accommodation space for receiving the metal container. The lifting device is ascendably and descendably disposed in the recess to move together with the metal container, such that the metal container is able to be lifted out of the recess and moved into the first accommodation space.

According to one or more embodiments of the disclosure, the metal container is closed in the anechoic chamber.

According to one or more embodiments of the disclosure, in the anechoic chamber, none of the wave-reflecting inner walls are disposed on a top portion of the metal container.

According to one or more embodiments of the disclosure, in the anechoic chamber, a top portion of the metal container does not completely cover the second accommodation space, and has at least one of the wave-reflecting inner walls merely for shielding the DUT.

With the structure described in the above embodiments, a user may select to move the second chamber into or out of the first chamber, such that a signal throughput test can be performed on the DUT under various test environments that are simulated by using only one anechoic chamber. Thus, additional anechoic chambers, and related equipment and manpower do not need to be prepared, and thus not only cost, manpower and test time can be saved, but also configuration space can be saved.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
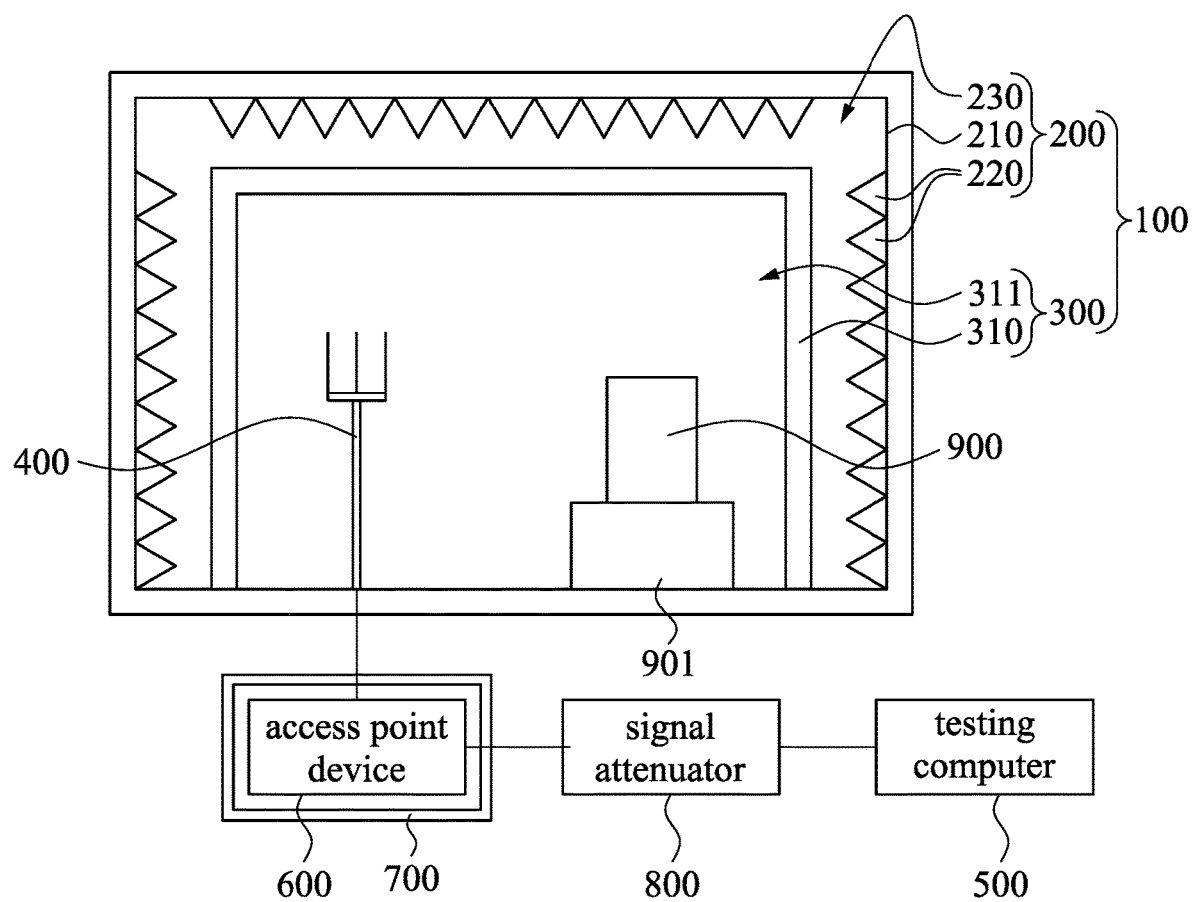
FIG. 1 is a schematic view of a signal test system according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Reference is now made to FIG. 1, in which FIG. 1 is a schematic view of a signal test system 10 according to one embodiment of the disclosure. As shown in FIG. 1, a signal test system 10 includes an anechoic chamber 100, an accessing antenna 400 and a testing computer 500. The anechoic chamber 100 includes a first chamber 200 and a second chamber 300. The first chamber 200 includes first inner walls 210 and wave absorbers 220. The first inner walls 210 collectively surround and define a first accommodation space 230, and the wave absorbers 220 are arranged on the first inner walls 210. The first inner walls 210 and the wave absorbers 220 form wave-absorbing inner walls. Thus, the first chamber 200 having the wave-absorbing inner walls can be configured to simulate an environment representing an open area test site (OATS) in which the electromagnetic wave signals transmitted by a wireless signal product are less reflected in.

The second chamber 300 is removably disposed in the first accommodation space 230. The second chamber 300 includes second inner walls 310 that collectively define a second accommodation space 311. Each of the second inner walls 310 includes wave-reflecting materials. The second inner walls 310 and the wave-reflecting materials form wave-reflecting inner walls for multiply reflecting electromagnetic wave signals transmitted from the wireless signal product. Thus, the second chamber 300 having the wave-reflecting inner walls can simulate an environment representing in an urban area or a crowded area in which the electromagnetic wave signals of the wireless signal product are severely reflected.

When the aforementioned environment representing the urban area or the crowded area is selected to be simulated, a user moves the second chamber 300 into the first accommodation space 230, and fixes the accessing antenna 400 and a device under test (DUT 900, e.g., wireless signal product) in the second accommodation space 311. The testing computer 500 is located outside the first chamber 200, and is electrically connected to the accessing antenna 400 for wirelessly performing a wireless signal test on the DUT 900 through the accessing antenna 400. In the embodiment, the second chamber 300 is further provided with a placement seat 901. The placement seat 901 is separated from the accessing antenna 400 for placing the DUT 900.

On the other hand, when an environment representing OATS is selected to be simulated, since the second chamber 300 is removably located in the first accommodation space 230, the user removes the second chamber 300 from the first accommodation space 230, and disposes both of the accessing antenna 400 and the DUT 900 in the first accommodation space 230. Thus, the testing computer 500 which is located outside the first chamber 200 can wirelessly perform a wireless signal test to the DUT 900 through the accessing antenna 400.

Specifically, as shown on FIG. 1, the first chamber 200 is a closed chamber, such as a full anechoic chamber or a radio frequency sealing body. The wave absorbers 220 include electromagnetic wave absorbing materials, and the wave absorbers 220 are, for example, tapered or wavy, but the disclosure is not limited thereto. The second chamber 300 has no wave absorbers therein, and the second chamber 300 is a closed chamber. For example, the second chamber 300 is a metal container or metal chamber which is composed of metal plates. When the metal plates collectively surround the DUT 900 and the accessing antenna 400, the second chamber 300 can be used to simulate the environment representing an urban or crowded area in which the electromagnetic wave signals from the DUT 900 are severely reflected. However, the disclosure is not limited thereto. In other embodiments, the inner walls of the second chamber are provided with a conductive film or a conductive cloth having electromagnetic wave reflection characteristics. The second chamber is, for example, a cube or a hexagon, but the disclosure is not limited thereto.

The second chamber 300 is a semi-anechoic chamber (SAC), and the size of the second accommodation space 311 is generally 7*4*3 (meters) for facilitating the engineer to install the DUT 900 in the second accommodation space 311. The semi-anechoic chamber (SAC) refers to one metal room which is totally formed from metal partitions and affixed with wave absorbers 220 on the metal partitions other than a floor part of the metal room, or the wave absorbers 220 are also affixed on the floor part other than aisles of the floor part. The metal partitions function to block external electromagnetic noises, because the signal throughput test for the DUT 900 cannot be precisely performed once the external electromagnetic noises are added during the test. On the other hand, the wave absorbers 220 function to eliminate constructive interference of the multi-phase signal reflection caused by multiple paths during the transmission between the DUT 900 and the accessing antenna 400.

Furthermore, the signal test system 10 further includes an access point device 600 and a signal shielding box 700. The testing computer 500 is electrically connected to the accessing antenna 400 through the access point device 600, and the access point device 600 is electrically connected to the accessing antenna 400 and the testing computer 500 through wires (not shown). The signal shielding box 700 hermetically receives the access point device 600 therein, and the signal shielding box 700 is used to shield external signals to avoid distortion of the signal between the access point device 600 in the signal shielding box 700 and the DUT 900. The signal test system 10 further includes a signal attenuator 800. The signal attenuator 800 is positioned between the testing computer 500 and the access point device 600, and is electrically connected to the testing computer 500 and the access point device 600 for simulating and providing weak signals to the DUT 900.

Figure 2:
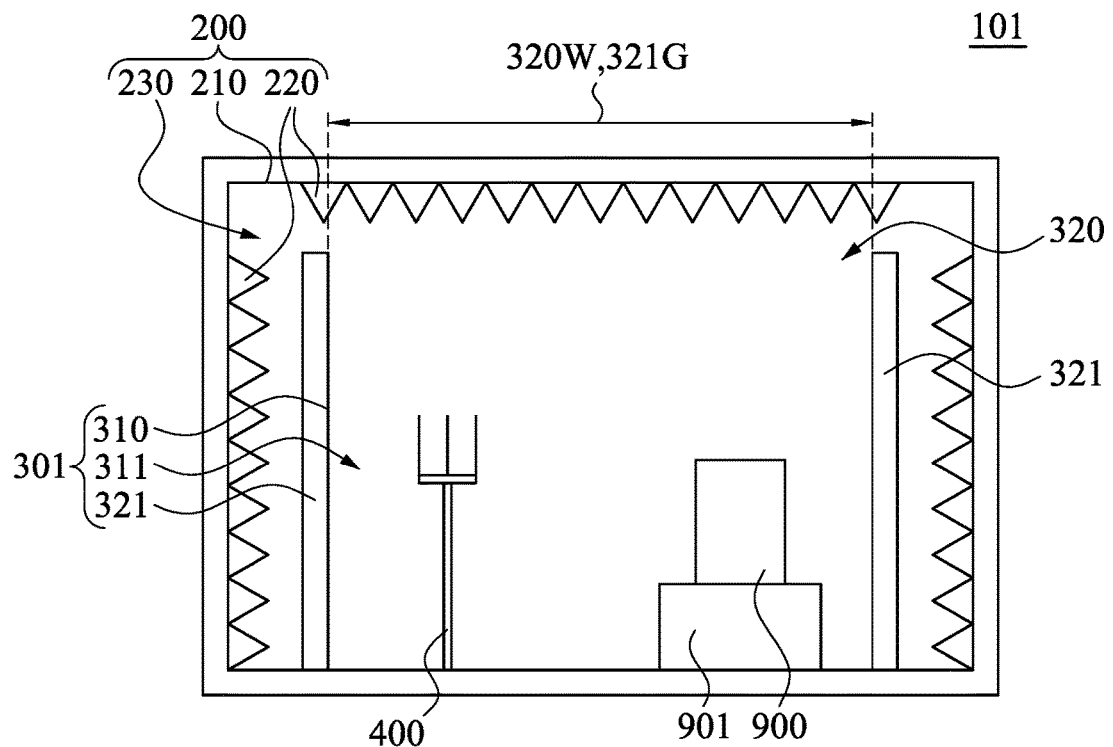
FIG. 2 is a schematic view of an anechoic chamber according to one embodiment of the disclosure.

FIG. 2 is a schematic view of an anechoic chamber 101 according to one embodiment of the disclosure. As shown in FIG. 2, the anechoic chamber 101 is substantially the same as the anechoic chamber 100 of FIG. 1, but at least one difference between the anechoic chamber 101 and the anechoic chamber 100 is that a second chamber 301 is unclosed. For one example, the second chamber 301 has no top portion, or the top portion of the second chamber 301 is provided without any wave-reflecting inner wall so as to simulate a situation in which a wireless signal product is located within an urban area without high-rise buildings nearby, such that the electromagnetic wave signals of the wireless signal product will not be reflected from above. Specifically, the top portion of the second chamber 301 is formed with a first opening 320, and a width 320W of the first opening 320 is substantially equal to a gap 321G between any two opposite sidewalls 321. In other words, there is no obstruction above the DUT 900 and the accessing antenna 400, and even above the second accommodation space 311.

Figure 3:
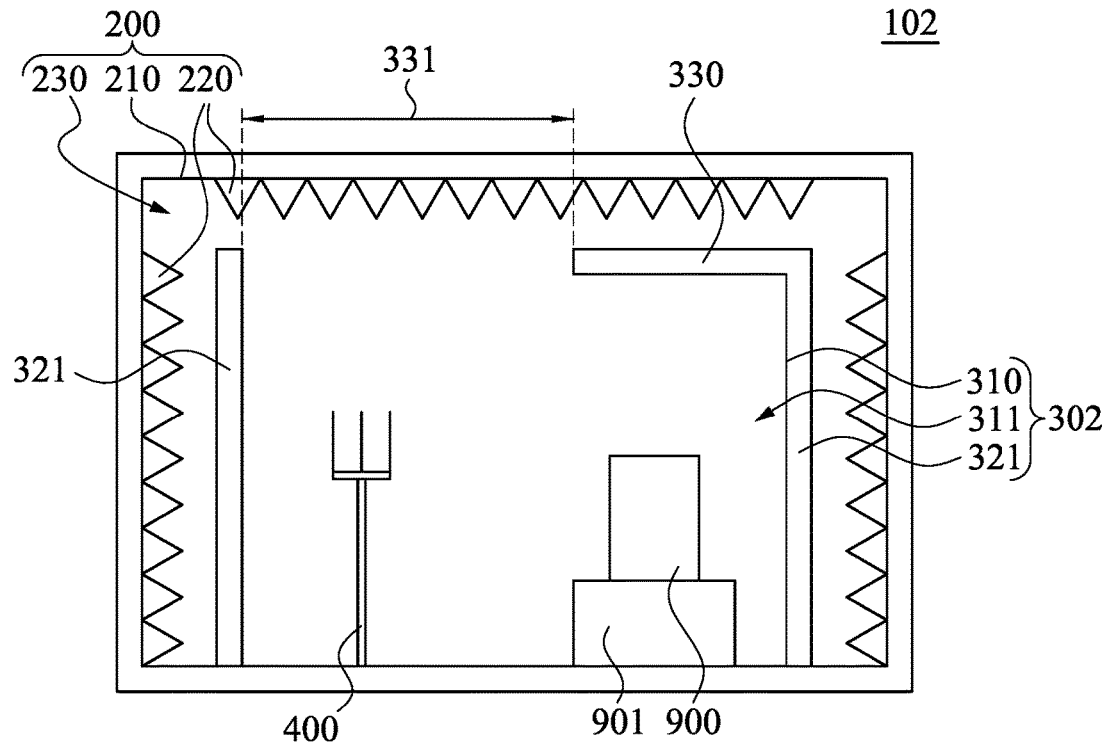
FIG. 3 is a schematic view of an anechoic chamber according to one embodiment of the disclosure.

FIG. 3 is a schematic view of an anechoic chamber 102 according to one embodiment of the disclosure. For another example, as shown in FIG. 3, a top portion of a second chamber 302 does not completely (i.e., partially only) cover the second accommodation space 311, and the top portion of the second chamber 302 has at least one of the wave-reflecting inner walls for merely shielding the DUT 900. Exemplarily, the top portion of the second chamber 302 has a metal top plate 330. One end of the metal top plate 330 is connected to one of two opposite sidewalls 321 of the second chamber 302, but is not connected to the other one of the two opposite sidewall 321, such that a second opening 331 is formed between the metal top plate 330 and the other one of the two opposite sidewall 321. The metal top plate 330 is directly located above the DUT 900, and only shields the DUT 900, i.e., the metal top plate 330 only overlaps with the DUT 900, thereby simulating a situation in which a wireless access point device is located at a high place without needing to consider signal reflection occurring in a situation in which a wireless signal product is located within an urban area with high-rise buildings nearby.

However, the above descriptions are merely illustrated as examples, and according to other requirements or limitations of another embodiment, the second opening 331 also can be formed on another sidewall of the second chamber 302 rather than on the top portion of the second chamber 302.

Figure 4A:
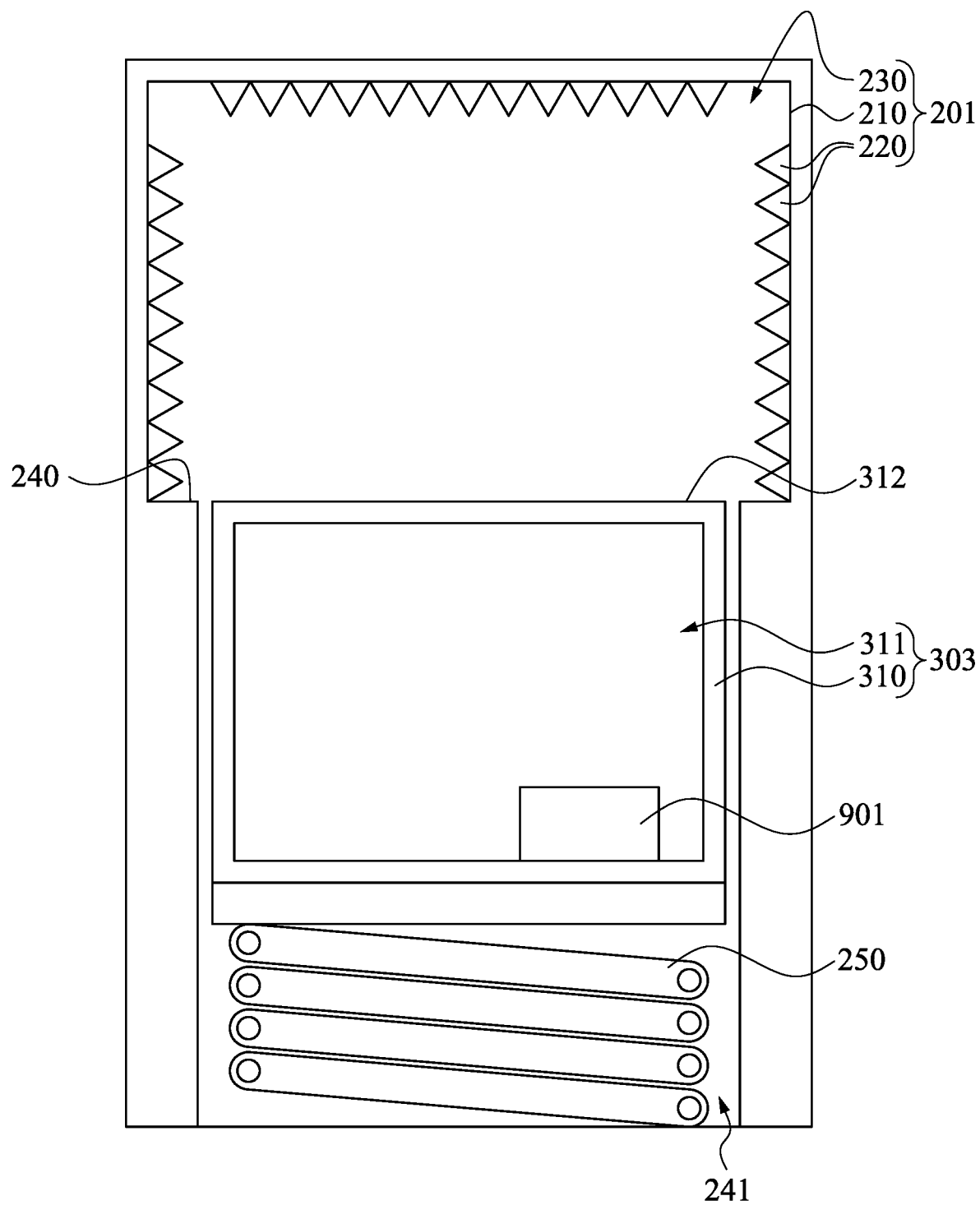
FIG. 4A and FIG. 4B are schematic operational views of an anechoic chamber according to one embodiment of the disclosure.
Figure 4B:
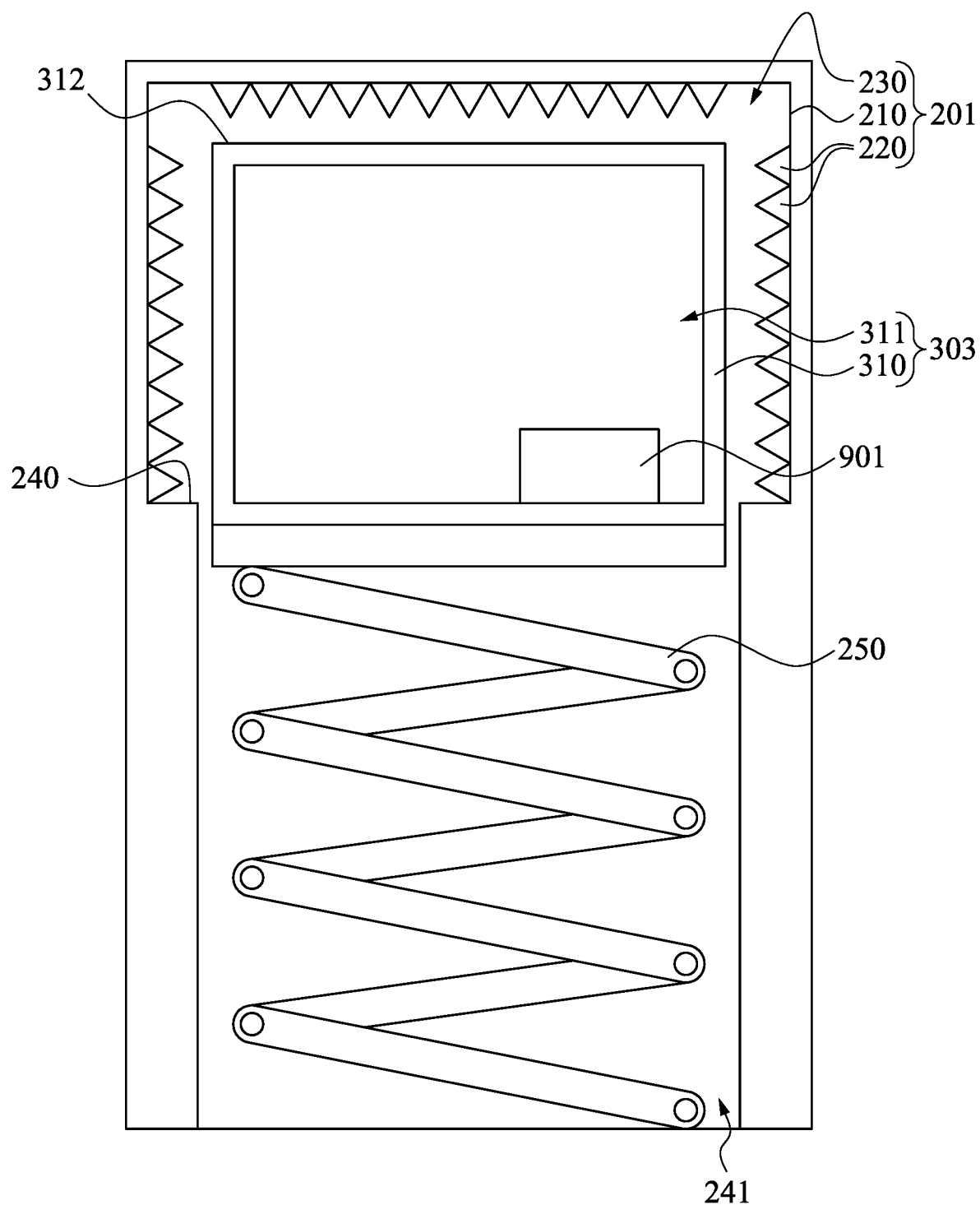

FIG. 4A and FIG. 4B are schematic operational views of an anechoic chamber 103 according to one embodiment of the disclosure. As shown in FIG. 4A and FIG. 4B, the anechoic chamber 103 is substantially the same as the anechoic chamber 100 of FIG. 1, but at least one difference between the anechoic chamber 100 and the anechoic chamber 103 is that, when the aforementioned environment representing an outdoor open space in which the electromagnetic wave signals are less reflected is simulated, the second chamber 303 does not need to be removed from the first chamber 201, and the second chamber 303 can be moved in the first chamber 201 so as to make the first accommodation space 230 be vacated.

For example, the first chamber 201 includes a recess 241 and a lifting device 250. The recess 241 is concavely formed on one inner wall (e.g., floor 240) of the first chamber 201, and communicates with the first accommodation space 230 for receiving the second chamber 303. The lifting device 250 is ascendably and descendably disposed in the recess 241 to move together with the second chamber 303. In the embodiment, the lifting device 250 is an electric motor, and is electrically connected to the testing computer 500, such that the testing computer 500 may electrically control the lifting device 250 to ascend and descend. However, the disclosure is not limited thereto, the lifting device 250 also can be a manual device such as a hydraulic lifting platform or a jack-like device or the like, rather than an electronic-controlled device.

Thus, when a situation in which the wireless signal product is simulated in an outdoor environment is selected to be provided, the lifting device 250 moves the second chamber 303 into the recess 241 from the first accommodation space 230 and thus the second chamber 303 leave the first accommodation space 230. Next, the accessing antenna can test a DUT with electromagnetic wave signal tests (e.g., signal throughput test) on the top surface 312 of the second chamber 303 in the first accommodation space 230. At this moment, the top surface 312 of the second chamber 303 is coplanar with the floor 240 of the first chamber 201.

Conversely, when a situation in which the wireless signal product is simulated in an urban area or a crowded area environment is selected to be provided, the lifting device 250 lifts the second chamber 303 outwards from the recess 241, and moves the second chamber 303 into the first accommodation space 230. Next, the accessing antenna can test a DUT on the placement seat 901 with electromagnetic wave signal tests (such as a signal throughput test) in the second chamber 303.

Figure 5A:
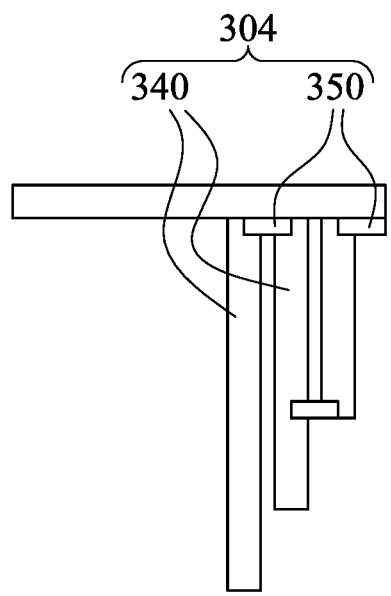
FIG. 5A and FIG. 5B are schematic operational views of a second chamber according to one embodiment of the disclosure.
Figure 5B:
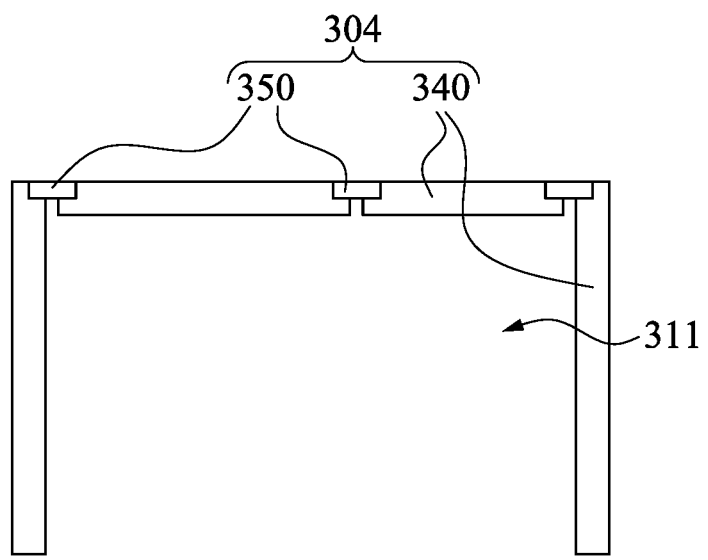

FIG. 5A and FIG. 5B are operational operational views of a second chamber 304 according to one embodiment of the disclosure. As shown in FIG. 5A and FIG. 5B, the second chamber 304 of FIG. 5B is substantially the same as the second chamber 300 of FIG. 1, but at least one difference from the second chamber 300 of FIG. 1 is that, the second chamber 304 is selectively formed in the first chamber (FIG. 1 or FIG. 4A) for simulating that the wireless signal product is in an outdoor environment or an urban/crowded area. For example, the second chamber 304 includes plates 340 and connecting portions 350. Each of the connecting portions is foldably connected to at least two of the plates 340. In this embodiment, the second chamber 304 is a metal container, and each of the plates 340 is a metal plate or a plastic plate having a conductive cloth or a conductive foil thereon.

As shown in FIG. 1 and FIG. 5B, when a situation in which the wireless signal product is in an urban area or a crowded area is selected to be simulated, after the user moves the second chamber 304 (shown in FIG. 5A) into the first accommodation space 230, the user sequentially spreads the plates 340 and the connecting portions 350, such that the plates 340 and the connecting portions 350 can be collectively assembled as a polygonal body having a second accommodating space 311. Thus, a DUT 900 can be tested with electromagnetic wave signal tests (e.g., signal throughput test) in the second accommodating space 311.

Conversely, as shown in FIG. 1 and FIG. 5A, when a situation in which the wireless signal product is in an outdoor environment is selected to be simulated, the user sequentially folds the plates 340 and the connecting portions 350 of the polygonal body shown in FIG. 5B to be the second chamber 304 of FIG. 5A, and moves the second chamber 304 of FIG. 5A away from the first accommodation space 230. Thus, a DUT 900 can be tested with electromagnetic wave signal tests (e.g., signal throughput test) in the first accommodation space 230. At this moment, the plates 340 and the connecting portion 350 that are folded and stacked together may be received in the first chamber 200 or removed from the first chamber 200.

Figure 6A:
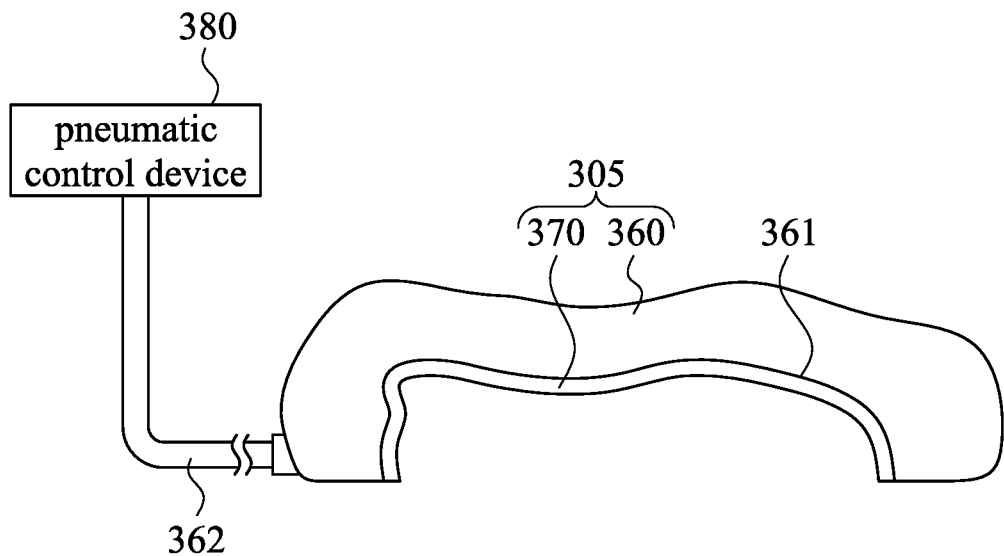
FIG. 6A and FIG. 6B are schematic operational views of a second chamber according to one embodiment of the disclosure.
Figure 6B:
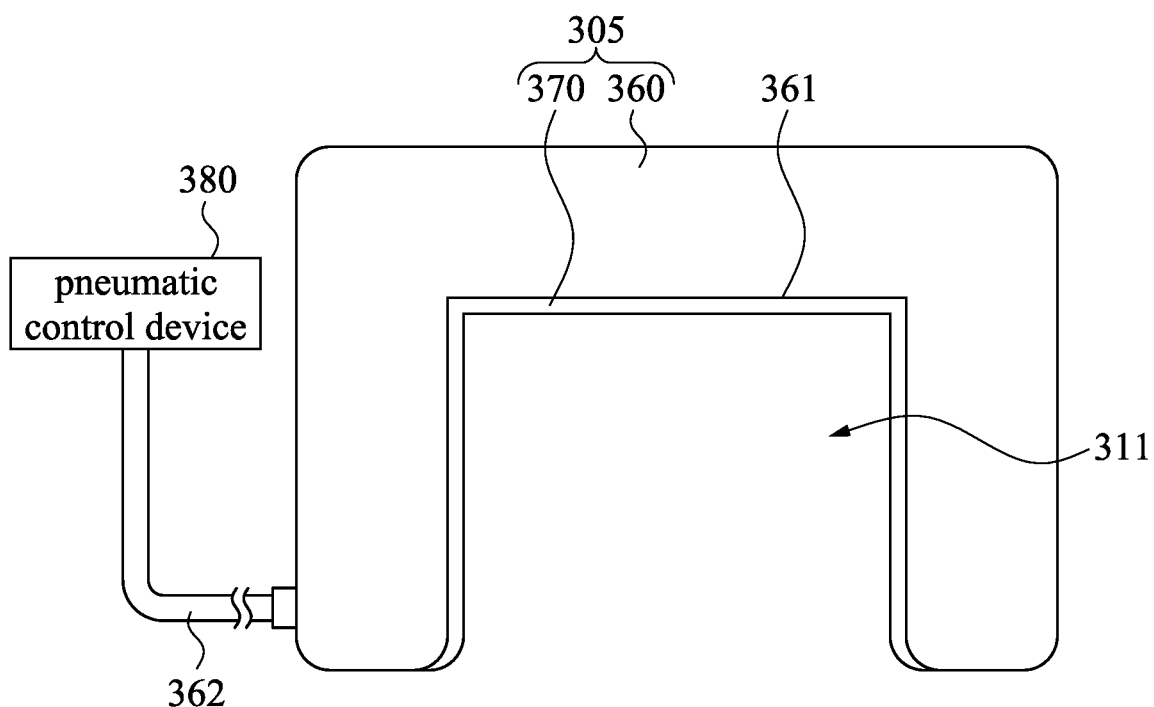

FIG. 6A and FIG. 6B are schematic operational views of a second chamber 305 according to one embodiment of the disclosure. As shown in FIG. 6A and FIG. 6B, the second chamber 305 of FIG. 6B is substantially the same as the second chamber 300 of FIG. 1, but at least one difference from the second chamber 300 of FIG. 1 is that, as shown in FIG. 1 and FIG. 6A, the second chamber 305 is selectively formed in the first chamber 200 for simulating that the wireless signal product is in an outdoor environment or an urban/crowded area. For example, the second chamber 305 includes an inflatable body 360 and at least one conductive film 370. The inflatable body 360 is coupled to a pneumatic control device 380 via air tubes 362. The pneumatic control device 380 is located outside the first chamber 200, and the pneumatic control device 380 can be driven to inflate the inflatable body 360 to form the second chamber 305. The conductive film 370 is fully attached to the inner walls 361 of the second chamber 305. For example, but not limited to, the conductive film 370 is a conductive film or a conductive cloth having electromagnetic wave reflection characteristics.

As shown in FIG. 1 and FIG. 6B, when a situation in which the wireless signal product is in an urban area or a crowded area is selected to be simulated, a user activates the pneumatic control device 380 to inflate the inflatable body 360 in the first accommodating space 230 so as to form a second chamber. Conversely, as shown in FIG. 1 and FIG. 6A, when a situation in which the wireless signal product is in an outdoor environment is selected to be simulated, the user activates the pneumatic control device 380 to deflate the inflatable body 360, such that the inflatable body 360 returns to the flat shape and the user moves the inflatable body 360 out of the first accommodating space 230.

Figure 7:
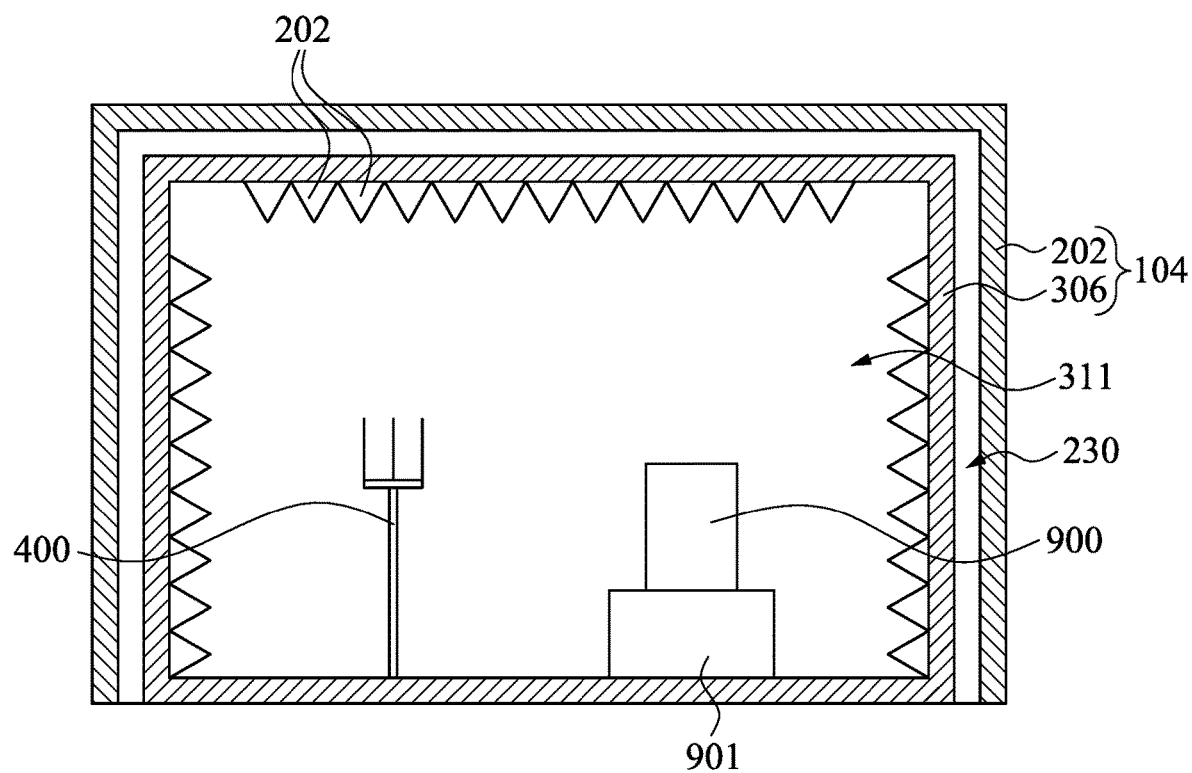
FIG. 7 is a schematic view of an anechoic chamber according to one embodiment of the disclosure.

FIG. 7 is a schematic view of an anechoic chamber 104 according to one embodiment of the disclosure. As shown in FIG. 7, the anechoic chamber 104 of FIG. 7 is substantially the same with the anechoic chamber 100 of FIG. 1, but at least one difference from the anechoic chamber 100 of FIG. 1 is that, a second chamber 306 having a wave absorbing inner wall is located within the first chamber 202 having a wave reflecting inner wall. Specifically, the second accommodating space 311 of the second chamber 306 can be used to simulate a situation in which the wireless signal product is in an outdoor environment; and conversely, if the second accommodating space 311 of the second chamber 306 is used to simulate a situation in which the wireless signal product is in an urban area or a crowded area, the second chamber 306 can be removed from the first chamber 202.

With the structure described in the above embodiments, a user can select to move the second chamber into or out from the first chamber, such that a DUT can be simulated to be tested by a signal throughput test under various test environments by using only one anechoic chamber. Thus, additional anechoic chambers, related equipment and manpower do not need to be prepared, thus not only saving cost, manpower and test time, but also saving configuration space.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A signal test system, comprising:
   a first chamber having a first accommodation space therein;
   a second chamber that is removably disposed in the first accommodation space and has a second accommodation space therein, wherein the second accommodation space is closed or unclosed;
   an accessing antenna disposed in the second accommodation space; and
   a testing computer that is located outside the first chamber and is electrically connected to the accessing antenna for wirelessly performing a wireless signal test on a device under test (DUT) located in the second accommodation space,
   wherein the first chamber is provided with wave-absorbing inner walls in the first accommodation space, and the second chamber is provided with wave-reflecting inner walls in the second accommodation space; or
   the first chamber is provided with wave-reflecting inner walls in the first accommodation space, and the second chamber is provided with wave-absorbing inner walls in the second accommodation space.

2. The signal test system of claim 1, wherein the second chamber comprises a plurality of plates and a plurality of connecting portions, and each of the connecting portions is foldably connected to at least two of the plates, thereby enabling the plates and the connecting portions to be assembled as a polygonal body collectively.

3. The signal test system of claim 1, wherein the first chamber comprises:
   a recess concavely formed on one inner wall of the first chamber, communicated with the first accommodation space for receiving the second chamber; and
   a lifting device ascendably and descendably disposed in the recess to move together with the second chamber, such that the second chamber is able to be lifted out of the recess and moved into the first accommodation space.

4. The signal test system of claim 1, further comprising:
   an access point device electrically connected to the accessing antenna and the testing computer through wires; and
   a signal shielding box hermetically receiving the access point device, and shielding external signals.

5. An anechoic chamber, comprising:
   a closed chamber comprising a plurality of wave-absorbing inner walls therein, the wave-absorbing inner walls collectively defining a first accommodation space, each of the wave-absorbing inner walls comprising a plurality of wave absorbers arranged thereon; and
   a metal container that is removably received in the first accommodation space and has a plurality of wave-reflecting inner walls therein, the wave-reflecting inner walls collectively defining a second accommodation space for receiving a device under test (DUT).

6. The anechoic chamber of claim 5, wherein the metal container comprises a plurality of plates and a plurality of connecting portions, and each of the connecting portions is foldably connected to at least two of the plates, thereby enabling the plates and the connecting portions to be assembled as a polygonal body, collectively.

7. The anechoic chamber of claim 5, wherein the closed chamber comprises:
- a recess concavely that is formed on one of the wave-absorbing inner walls of the closed chamber and communicates with the first accommodation space for receiving the metal container; and
- a lifting device ascendably and descendably disposed in the recess to move together with the metal container, such that the metal container is able to be lifted out of the recess and moved into the first accommodation space.

8. The anechoic chamber of claim 5, wherein the metal container is closed.

9. The anechoic chamber of claim 5, wherein none of the wave-reflecting inner walls is disposed on a top portion of the metal container.

10. The anechoic chamber of claim 5, wherein a top portion of the metal container does not completely cover the second accommodation space, and has at least one of the wave-reflecting inner walls merely for shielding the DUT.

* * * * *